United States Patent
Terazawa (10) Patent No.: US 9,276,600 B2
(45) Date of Patent: Mar. 1, 2016

(54) OUTPUT CHANGING METHOD FOR AN A/D CONVERSION APPARATUS AND A/D CONVERSION APPARATUS

(71) Applicant: DENSO CORPORATION, Kariya, Aichi-pref. (JP)

(72) Inventor: Tomohito Terazawa, Yokohama (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/635,513

(22) Filed: Mar. 2, 2015

(65) Prior Publication Data

US 2015/0249461 A1 Sep. 3, 2015

(30) Foreign Application Priority Data

Mar. 3, 2014 (JP) .................................. 2014-040723

(51) Int. Cl.
*H03M 1/50* (2006.01)
*H03M 1/12* (2006.01)

(52) U.S. Cl.
CPC ................ *H03M 1/12* (2013.01); *H03M 1/129* (2013.01); *H03M 1/502* (2013.01)

(58) Field of Classification Search
CPC ......... H03M 1/50; H03M 1/12; H03M 1/129; H03M 1/502
USPC .................................................. 341/157, 166
See application file for complete search history.

(56) References Cited

U.S. PATENT DOCUMENTS

| 5,396,247 | A | 3/1995 | Watanabe et al. |
|---|---|---|---|
| 7,355,544 | B2 * | 4/2008 | Watanabe ...................... 341/157 |
| 7,595,686 | B2 * | 9/2009 | Maksimovic et al. ........ 327/540 |
| 8,681,028 | B2 * | 3/2014 | Terazawa ...................... 341/120 |

FOREIGN PATENT DOCUMENTS

JP 05-259907 10/1993

OTHER PUBLICATIONS

Frankiewicz et al., Asynchronous 4-bit Flash Analog-to-digital CMOS Converter with Over- and Underflow Detection System, 16th International Conference "Mixed Design of Integrated Circuits and Systems", Jun. 25-27, 2009, Lodz, Poland, IEEE.*

* cited by examiner

*Primary Examiner* — Howard Williams
(74) *Attorney, Agent, or Firm* — Harness, Dickey & Pierce, P.L.C.

(57) ABSTRACT

An output changing method of an A/D conversion apparatus is provided. The apparatus includes a pulse delay circuit in which delay units are connected in series, and an encoding circuit which detects the number of stages of the delay units, through which a pulse signal passes during predetermined measurement time, and generates numeric data corresponding to the number of stages. The apparatus receives an analog input signal as power supply voltage of the pulse delay circuit to perform A/D conversion for the analog input signal. The method includes determining whether or not the analog input signal is within an allowable voltage range in which the apparatus operates normally, outputting the numeric data as an A/D conversion value if the analog input signal is within the range, and outputting numeric data formed of a specified value as the A/D conversion value if the analog input signal is not within the range.

6 Claims, 6 Drawing Sheets

MUX OUTPUT CHANGING CHARACTERISTICS

| DET1 | DET2 | SEL1_1 | SEL1_2 | SEL2_1 | SEL2_2 | MUX OUTPUT |
|---|---|---|---|---|---|---|
| 0 | 0 | — | — | — | — | "0····0" |
| 1 | 1 | — | — | — | — | "1····1" |
| 1 | 0 | 0 | 0 | 0 | 0 | DT |
| 1 | 0 | 0 | 0 | 0 | 1 | "1····1" |
| 1 | 0 | 0 | 0 | 1 | 1 | "1····1" |
| 1 | 0 | 1 | 0 | 0 | 0 | "0····0" |
| 1 | 0 | 1 | 0 | 1 | 1 | "1····1" |
| 1 | 0 | 1 | 1 | 0 | 0 | "0····0" |
| 1 | 0 | 1 | 1 | 0 | 1 | "0····0" |
| 1 | 0 | 1 | 1 | 1 | 1 | "0····0" |

OUTPUT CHANGING METHOD FOR AN A/D CONVERSION APPARATUS AND A/D CONVERSION APPARATUS

CROSS-REFERENCE TO RELATED APPLICATION

This application is based on and claims the benefit of priority from earlier Japanese Patent Application No. 2014-40723 filed Mar. 3, 2014, the description of which is incorporated herein by reference.

BACKGROUND

1. Technical Field

The present invention relates to an A/D (analog-digital) conversion apparatus which performs A/D conversion of an analog input signal by using a pulse delay circuit, in particular, relates to an output changing method of changing output of an A/D converted value and an A/D conversion apparatus realizing the method.

2. Related Art

An A/D conversion apparatus is known which uses a pulse delay circuit, which is configured by connecting in a ring shape a plurality of delay units including various gate circuits such as an inverter, to convert an analog input signal to numeric data (see, for example, JP-A-5-259907).

In this type of A/D conversion apparatus, an analog input signal subject to A/D conversion is applied as power supply voltage of the delay units configuring the pulse delay circuit to vary delay time caused when a pulse signal passes the delay units depending on the signal level of the analog input signal.

Then, an encoding circuit counts the number of stages of the delay units, through which the pulse signal has passed within a predetermined sampling time, to output the count value as an A/D converted value of the analog input signal.

In the above A/D conversion apparatus, the delay units in the pulse delay circuit operate using the analog input signal as the power supply voltage. Hence, the signal levels of the pulse signals outputted from the delay units are voltage values corresponding to the analog input signal.

Hence, the signal levels of the pulse signals outputted from the delay unit vary. If the varied signal levels deviate from a normal voltage range within which the encoding circuit can count the number of stages of the delay units, through which the pulse signal has passed, errors are caused in the A/D converted value.

That is, the encoding circuit detects a rising (or falling) edge of the pulse signal outputted from the delay unit when an output of the delay unit changes form a low level to a high level (or from a high level to a low level). Then, the number of stages of the delay units is detected, through which the pulse signal has passed in the pulse delay circuit, based on the number of times of detection of edges and the positions of the delay units which have detected the edges.

Hence, if the signal level of the pulse signal outputted from the delay unit in the pulse delay circuit is equal to or more than a threshold voltage by which the encoding circuit can distinguish between the low level and the high level of the pulse signal, the encoding circuit can detect the edge of the pulse signal.

However, if the voltage level of the analog input signal is lower, and the signal level of the pulse signal outputted from the delay unit in the pulse delay circuit decreases below the threshold voltage of the encoding circuit, the encoding circuit cannot correctly detect the number of stages of the delays unit through which the pulse signal has passed.

In addition, if the voltage level of the analog input signal is higher, the delay time is shortened which is caused when the pulse signal passes through the delay units in the pulse delay circuit.

Hence, if the voltage level of the analog input signal becomes higher, the speed of the pulse signal in the pulse delay circuit becomes too high compared with the operating time required for detecting the number of stages of the delay units by the encoding circuit. Accordingly, the encoding circuit may not correctly detect the number of stages of the delay units.

Figure 9:
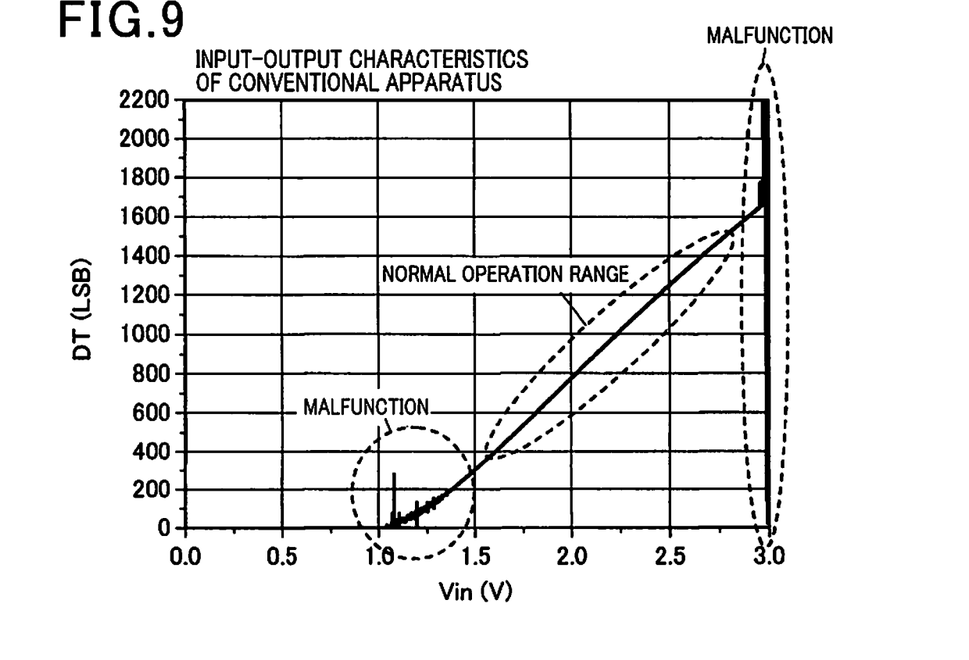
FIG. 9 is a diagram showing input-output characteristics of a conventional A/D conversion apparatus.

Hence, in the above A/D conversion apparatus, as shown in FIG. 9, if the voltage level of an analog input signal Vin deviates from a normal operation range of the encoding circuit, the encoding circuit malfunctions. Thereby, A/D conversion cannot be correctly performed for the analog input signal Vin.

SUMMARY

An embodiment provides an output changing method for an A/D conversion apparatus and an A/D conversion apparatus, which performs A/D conversion for an analog input signal by using a pulse delay circuit, to prevent an erroneous A/D converted value from being outputted when the voltage level of the analog input signal deviates from a normal operation range.

As an aspect of the embodiment, an output changing method of an A/D conversion apparatus is provided. The A/D conversion apparatus includes a pulse delay circuit in which a plurality of delay units, which delay a pulse signal by a delay time depending on power supply voltage, are connected in series; and an encoding circuit which detects the number of stages of the delay units, through which the pulse signal passes in the pulse delay circuit during a predetermined measurement time, and generates numeric data corresponding to the number of stages. The A/D conversion apparatus receives an analog input signal as the power supply voltage of the pulse delay circuit to perform A/D conversion for the analog input signal. The method includes determining whether or not the analog input signal is within an allowable voltage range in which the A/D conversion apparatus operates normally; outputting the numeric data generated by the encoding circuit as an A/D conversion value of the analog input signal if the analog input signal is within the allowable voltage range; and outputting numeric data formed of a predetermined specified value as the A/D conversion value if the analog input signal is not within the allowable voltage range.

DETAILED DESCRIPTION OF THE PREFERRED EMBODIMENTS

With reference to the accompanying drawings, hereinafter are described embodiments of the present invention.

Figure 1:
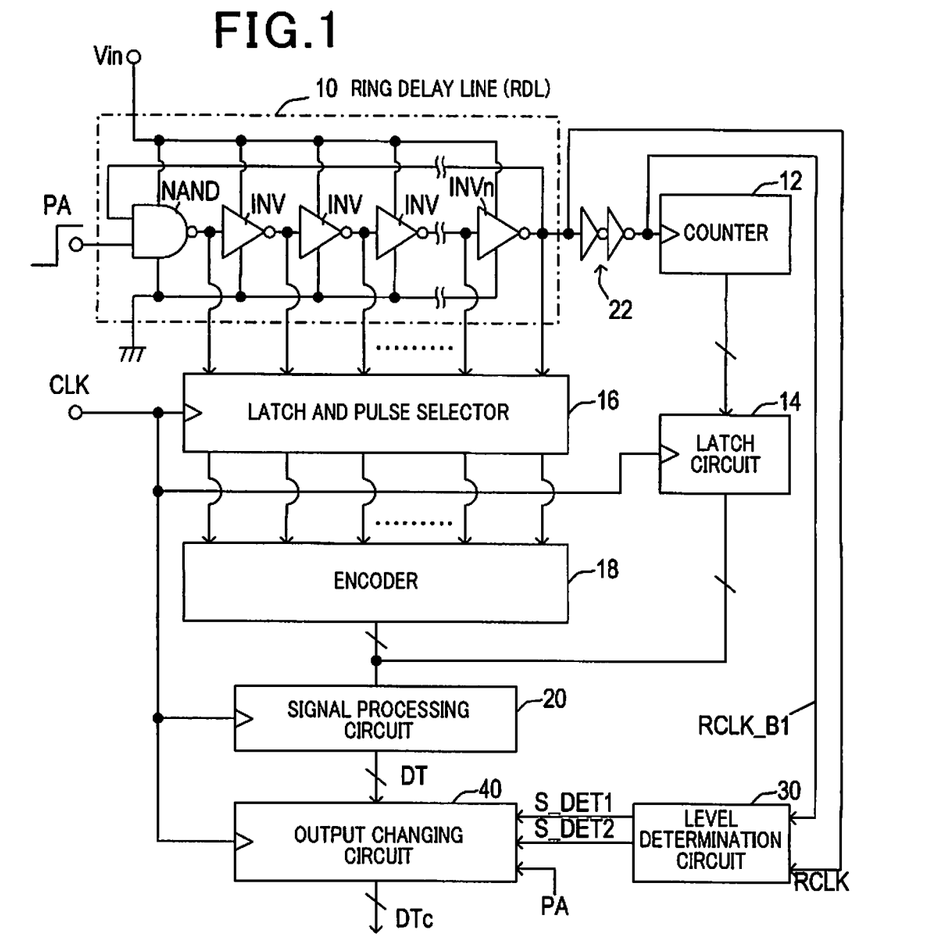
FIG. 1 is a block diagram showing the whole configuration of an A/D conversion apparatus according to an embodiment.

As shown in FIG. 1, an A/D conversion apparatus of the present embodiment includes a ring delay line (RDL) 10, a counter 12, a latch circuit 14, a latch and pulse selector 16, an encoder 18, and a signal processing circuit 20.

The RDL 10 corresponds to a pulse delay circuit. The RDL 10 includes one negative AND circuit NAND serving as a delay unit, whose one input terminal receives a start signal PA, and n (even number) of inverters INV serving as inverting circuits.

That is, the RDL 10 is configured to be a ring shape, in which n (even number) of inverters INV are connected in series to the output terminal of the negative AND circuit NAND, and the output terminal of the last-stage inverter INVn is connected to the other input terminal of the negative AND circuit NAND.

Hence, in the RDL 10, when one input terminal of the negative AND circuit NAND at the first stage is at a low level, an output of the negative AND circuit NAND becomes a high level. Hence, an output of the last-stage inverter INVn becomes a high level, which is stabilized.

In contrast, when a start signal PA (high level) is inputted into one input terminal of the negative AND circuit NAND at the first stage, both the two input terminals of the negative AND circuit NAND become high levels. Hence, the output of the negative AND circuit NAND is inverted to a low level.

Then, outputs of, n of the inverters INV are sequentially inverted every time when inversion operation time of each inverter INV has passed. When the output of the last-stage inverter INVn becomes a low level, the output of the negative AND circuit NAND becomes a high level after the inversion operation time has passed. Thereafter, the outputs of the inverters and the output of the negative AND circuit NAND are sequentially inverted.

As a result, when the start signal PA (high level) is inputted, a pulse signal circulates in the RDL 10 with a period which is determined by the inversion operation time of each of the delay units (negative AND circuit NAND and inverters INV) and the number of connected stages (n+1). From the inverter INVn, which is the last-stage delay unit, the pulse signal is outputted as a clock signal RCLK.

Next, the counter 12 receives the output (RCLK) of the last-stage inverter INVn of the RCL 10 via a buffer circuit 22 configured by front-and-back two-stage inverting circuits. The counter 12 counts rising edges of the output to count the number of circulations of the pulse signal in the RDL 10.

In addition, the latch circuit 14 operates when receiving an operation clock CLK whose period is predetermined measurement time for A/D conversion, and latches a count value of the counter 12 at a rising edge of the operation clock CLK.

In addition, the latch and pulse selector 16 receives the operation clock CLK to latch outputs of the delay units (negative AND circuit NAND and inverters INV) configuring the RDL 10. The latch and pulse selector 16 detects the rising position of the circulating pulse signal in the RDL 10 based on the signal level of the latched output.

In addition, the encoder 18 converts the rising position detected by the latch and pulse selector 16 to numeric data (binary digital data).

In addition, the signal processing circuit 20 receives the numeric data from the latch circuit 14 as high-order bits and the numeric data from the encoder 18 as low-order bits. The signal processing circuit 20 adds the received low-order bit data to the received high-order bit and calculates the difference between the result of the previous addition and the result of the current addition. Thereby, the signal processing circuit 20 generates numeric data DT representing the number of stages of the delay units (negative AND circuit NAND and inverters INV) through which the pulse signal has passed in the RDL 10, within the measurement time determined by the period of the operation clock CLk.

Note that the above configuration is known as a pulse phase difference encoding circuit or a time A/D conversion circuit (TAD) and is disclosed in JP-A-5-259907. Hence, detailed descriptions of the above configuration are omitted.

The A/D conversion apparatus of the present embodiment receives the analog input signal Vin subject to A/D conversion as power supply voltage of the delay units (negative AND circuit NAND and inverters INV) configuring the RDL 10 to vary delay operating time of the delay units (negative AND circuit NAND and inverters INV) depending on the signal level (voltage value) of the analog input signal Vin.

As a result, the numeric data DT generated by the signal processing circuit 20 varies depending on the signal level (voltage value) of the analog input signal Vin. The A/D conversion apparatus of the present embodiment outputs the numeric data DT as an A/D converted value of the analog input signal Vin.

Meanwhile, in the A/D conversion apparatus of the present embodiment, since the power supply voltage of the delay units in the RDL 10 is the voltage of the analog input signal Vin subject to A/D conversion, the signal levels of the pulse signals outputted from the delay units vary depending on the analog input signal Vin.

Hence, when the signal level of the analog input signal Vin decreases, the buffer circuit 22 or the latch and pulse selector 16 may not correctly detect the pulse signals outputted from the delay units of the RDL 10. Hence, errors may be caused in the A/D converted value outputted from the signal processing circuit 20.

That is, in the A/D conversion apparatus, units other than the delay units (negative AND circuit NAND and inverters INV) in the RDL 10 operate with supply of the power supply voltage (DC constant voltage) Vd generated by a power supply circuit, which is not shown.

Hence, a threshold voltage used when the buffer circuit 22 varies output thereof from a low level to a high level on receiving the pulse signal (high level) from the RDL 10 (i.e. a threshold voltage required for inputting a pulse signal (high level) to the counter 12 via the buffer circuit 22) is an intermediate value of the power supply voltage Vd, that is, substantially Vd/2.

Hence, when the signal level of the analog input signal Vin decreases, and the voltage values of the pulse signals (high level) outputted from the delay units of the RDL 10 become lower than the threshold voltage Vd/2 of the buffer circuit 22, the counter 12 cannot detect the pulse signal outputted from the RDL 10.

In addition, when the voltage values of the pulse signals (high level) outputted from the delay units of the RDL 10 become lower than the threshold voltage of an input buffer receiving the pulse signals, the latch and pulse selector 16 cannot detect the rising position of the pulse signal in the RDL 10.

Note that the threshold voltage of the input buffer receiving the pulse signals from the delay units of the RDL are substantially the same as the threshold voltage of the buffer circuit 22. However, the threshold voltage of the buffer circuit 22 is higher than the threshold voltage of the latch and pulse selector 16.

In addition, when the signal level of the analog input signal Vin is higher, circulation speed of the pulse signal in the RDL 10 becomes higher. Hence, the counter 12 and the latch and pulse selector 16 are delayed in operation, which may not correctly detect the number of stages of the delay units through which the pulse signal has passed in the RDL 10.

Hence, the A/D conversion apparatus of the present embodiment further includes a level determination circuit 30 and an output changing circuit 40.

The level determination circuit 30 determines whether or not the signal level (voltage value) of the analog input signal Vin is within an allowable voltage range in which the A/D conversion apparatus can normally operate. The configuration of the level determination circuit 30 is shown in FIG. 2.

Figure 4:
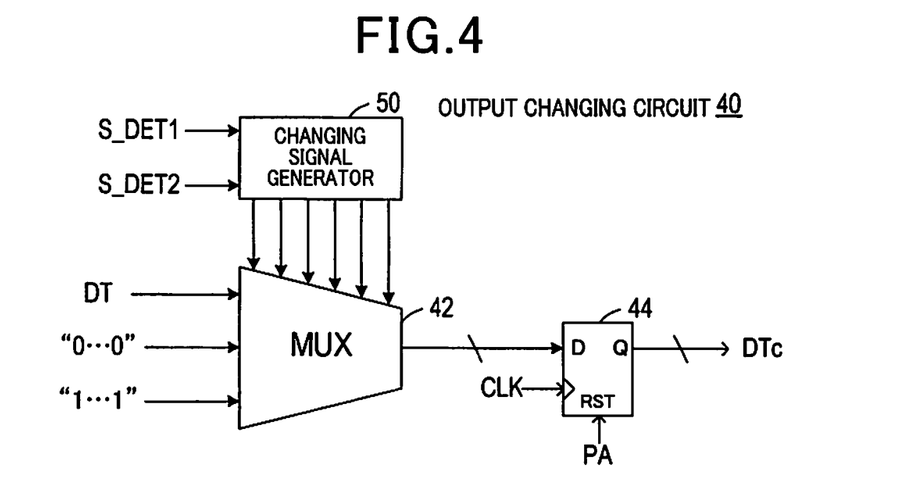
FIG. 4 is a circuit diagram showing a configuration of an output changing circuit shown in FIG. 1.
Figure 5:
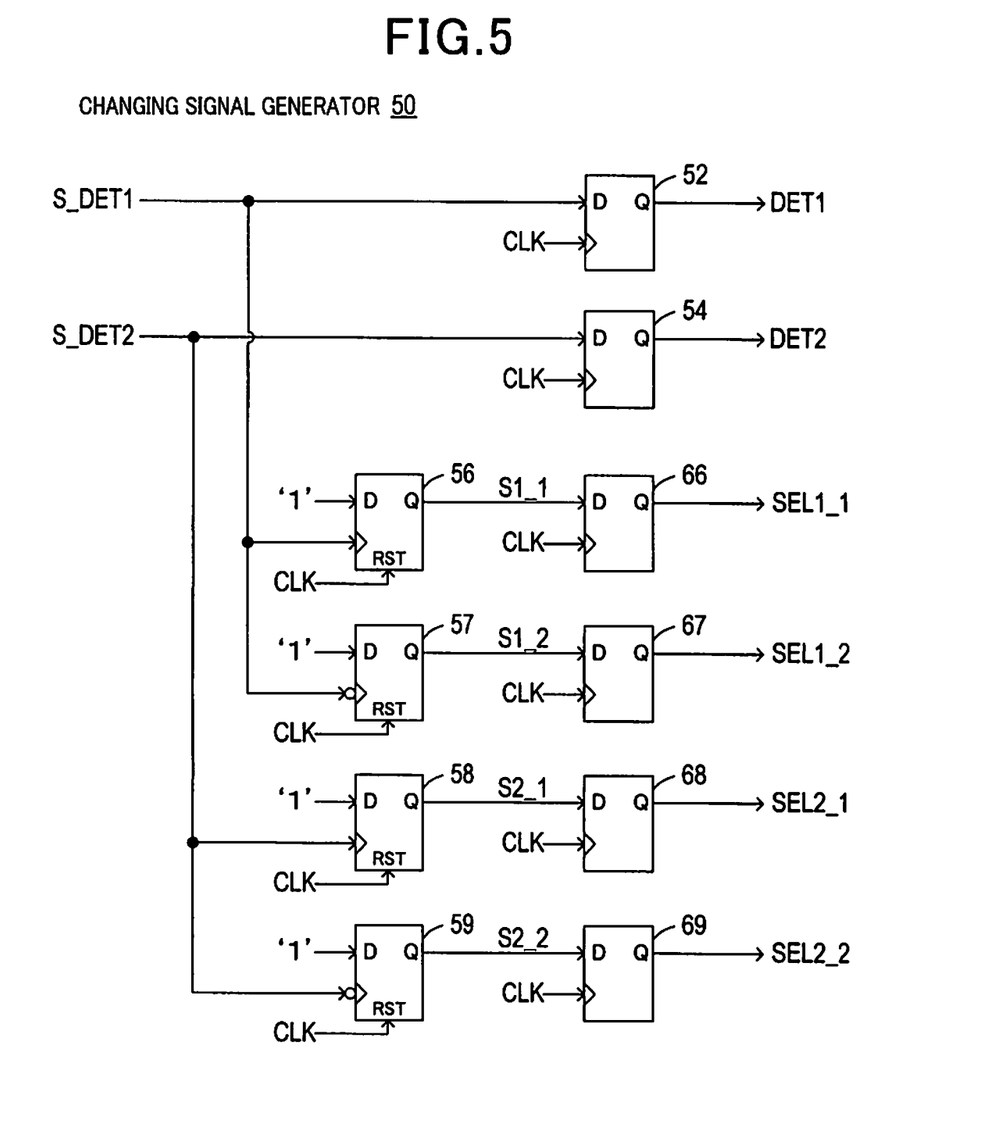
FIG. 5 is a circuit diagram showing a configuration of a changing signal generator shown in FIG. 4.

In addition, the output changing circuit 40 changes an A/D conversion value to be outputted between a state where the numeric data DT outputted from the signal processing circuit 20 is outputted as the A/D conversion value and a state where a predetermined fixed value ("00 . . . 00" or "11 . . . 11") is outputted as the A/D conversion value, depending on the result of the determination by the level determination circuit 30. The output changing circuit 40 is configured as shown in FIGS. 4 and 5.

Figure 2:
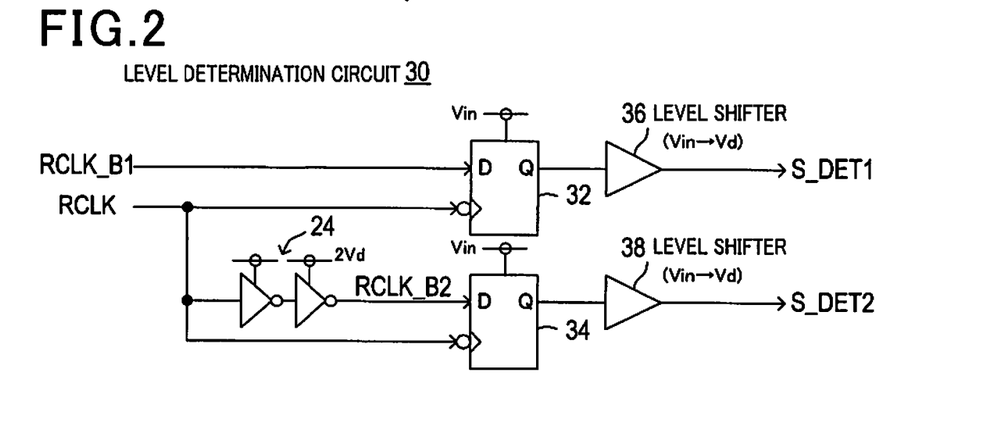
FIG. 2 is a circuit diagram showing a configuration of a level determination circuit shown in FIG. 1.

As shown in FIG. 2, the level determination circuit 30 receives the clock signal RCLK outputted from the last-stage inverter INVn of the RDL 10 and a clock signal RCLK_B1 which corresponds to the clock signal RCLK passing through the buffer circuit 22.

The clock signal RCLK_B1 is inputted to a latch circuit 32. The clock signal RCLK is inputted to a latch circuit 34 as a clock signal RCLK_B2 via a buffer circuit 24 configured by front-and-back two-stage inverting circuits.

Note that the inverting circuits configuring the buffer circuit 24 are configured so as to operate by receiving power supply voltage 2Vd which is twice the power supply voltage Vd of other circuits in the A/D conversion apparatus. Hence, a threshold voltage used when the buffer circuit 24 detects the high-level clock signal RCLK and outputs the high-level clock signal RCLK_B2 is substantially the same as the power supply voltage Vd.

Figure 3A:
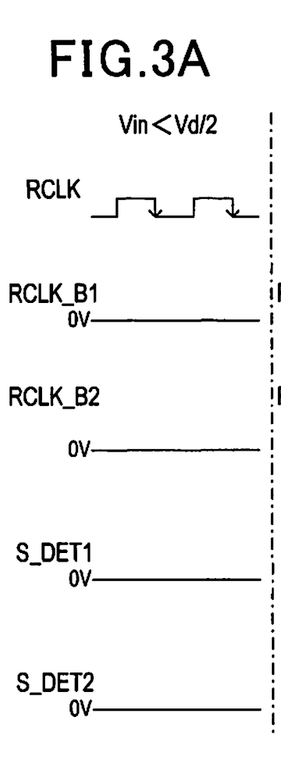
FIGS. 3A, 3B and 3C are time charts for explaining operation of the level determination circuit.
Figure 3B:
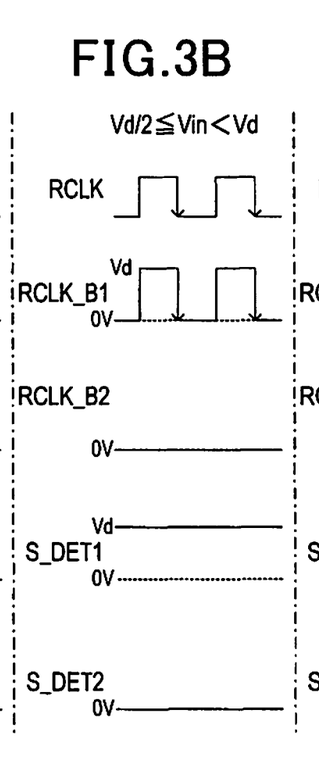
Figure 3C:
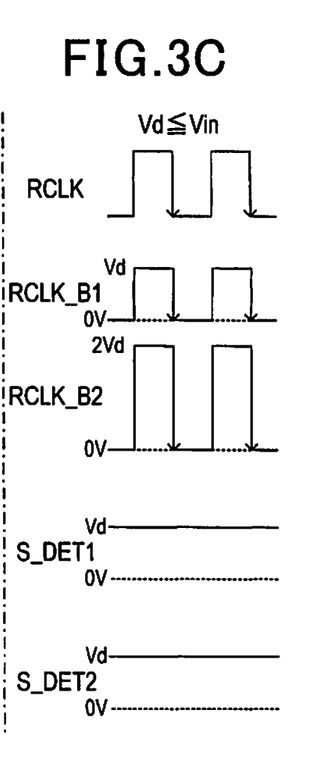

In addition, as shown in FIGS. 3A to 3C, the latch circuits 32, 34 are configured so as to latch an input signal at a falling edge of the clock signal RCLK. In addition, the analog input signal Vin is used as the power supply voltage of the latch circuits 32, 34.

As a result, in the level determination circuit 30, outputs of the latch circuits 32, 34 vary depending on the signal level of the analog input signal Vin.

That is, as shown in FIG. 3A, when the signal level of the analog input signal Vin is lower than the threshold voltage Vd/2 of the buffer circuit 22, both the outputs of the buffer circuits 22, 24 are kept at a low level (0V). Hence, in this state, both the outputs of the latch circuits 32, 34 also become a low level (0V).

Note that, as described above, the threshold voltage Vd/2 of the buffer circuit 22 is higher than the threshold voltage of the input buffer of the latch and pulse selector 16. Hence, when the latch and pulse selector 16 cannot detect the pulse signals outputted from the RDL 10, a pulse signal (high level) is not inputted to the latch circuit 32. Hence, output of the latch circuit 32 does not become a high level.

In addition, as shown in FIG. 3B, when the signal level of the analog input signal Vin is equal to or higher than the threshold voltage Vd/2 of the buffer circuit 22 and is lower than the threshold voltage Vd of the buffer circuit 24, the buffer circuit 22 outputs the clock signal RCLK_B1 (high level: Vd) synchronized with the clock signal RCLK to keep the output of the buffer circuit 24 at a low level (0V). Hence, in this state, the output of the latch circuit 32 is kept at a high level, and the output of the latch circuit 34 is kept at a low level.

In addition, as shown in FIG. 3C, when the signal level of the analog input signal Vin is equal to or higher than the threshold voltage Vd of the buffer circuit 24, the buffer circuits 22, 24 respectively output the clock signals RCLK_B1 (high level: Vd) and RCLK_B2 (high level: 2Vd) synchronized with the clock signal RCLK. Hence, in this state, both the outputs of the latch circuits 32, 34 are kept at a high level.

Output terminals of the latch circuits 32, 34 are provided with level shifters 36, 38. When signals outputted from the latch circuits 32, 34 are a high level (Vin), the level shifters 36, 38 shift the signal level to the power supply voltage Vd. Hence, the level determination circuit 30 outputs of the latch circuits 32, 34 via the level shifters 36, 38 as determination signals S_DET1, S_DET2 (see FIG. 3).

As shown in FIG. 4, the output changing circuit 40 includes a changing signal generator 50, a multiplexer (MUX) 42, and a latch circuit 44.

The changing signal generator 50 generates a changing signal for changing numeric data based on the two determination signals S_DET1, S_DET2 outputted from the level determination circuit 30.

In addition, the MUX 42 selects any of numeric data DT outputted from the signal processing circuit 20, and the predetermined fixed values "00 . . . 00" and "11 . . . 11" as numeric data DTc outputted from the A/D conversion apparatus, based on the changing signal received from the changing signal generator 50.

In addition, the latch circuit 44 is an output circuit which latches the numeric data DTc selected by the MUX 42 at a rising edge of the operation clock CLK to output the numeric data (i.e. A/D converted value) DTc in synchronization with the operation clock CLK. Note that the latch circuit 44 is reset when the start signal PA is not inputted (i.e. low level).

Next, the changing signal generator 50 includes determination signal latch circuits 52, 54 which latch the determination signals S_DET1, S_DET2 outputted from the level determination circuit 30 at rising timing of the operation clock CLK to output the determination signals S_DET1, S_DET2 as changing signals DET1, DET2 to the MUX 42.

In addition, the changing signal generator 50 includes fixed value latch circuits 56, 57, 58, 59. The fixed value latch circuits 56, 57 latch a signal of value "1" (high level) at rising timing and falling timing of the determination signal S_DET1 (i.e. inversion timing of the determination signal S_DET1). The fixed value latch circuits 58, 59 latch a signal of value "1" (high level) at rising timing and falling timing of the determination signal S_DET2 (i.e. inversion timing of the determination signal S_DET2).

Note that the fixed value latch circuits 56, 57, 58, 59 are reset at rising timing of the operation clock and output a signal of value "0" (low level).

In addition, the changing signal generator 50 includes output latch circuits 66, 67, 68, 69 which latch outputs S1_1, S1_2, S2_1, S2_2 of the fixed value latch circuits 56, 57, 58, 59 at rising timing of the operation clock and output them as changing signals SEL1_1, SEL1_2, SEL2_1, SEL2_2 to the MUX 42.

Hence, the MUX 42 selects any of numeric data DT which is an A/D converted value, and the fixed values "00 . . . 00" and "11 . . . 11" as numeric data DTc outputted from the A/D conversion apparatus, based on the six changing signals DET1, DET2, SEL1_1, SEL1_2, SEL2_1, SEL2_2 received from the changing signal generator 50.

Figure 6:
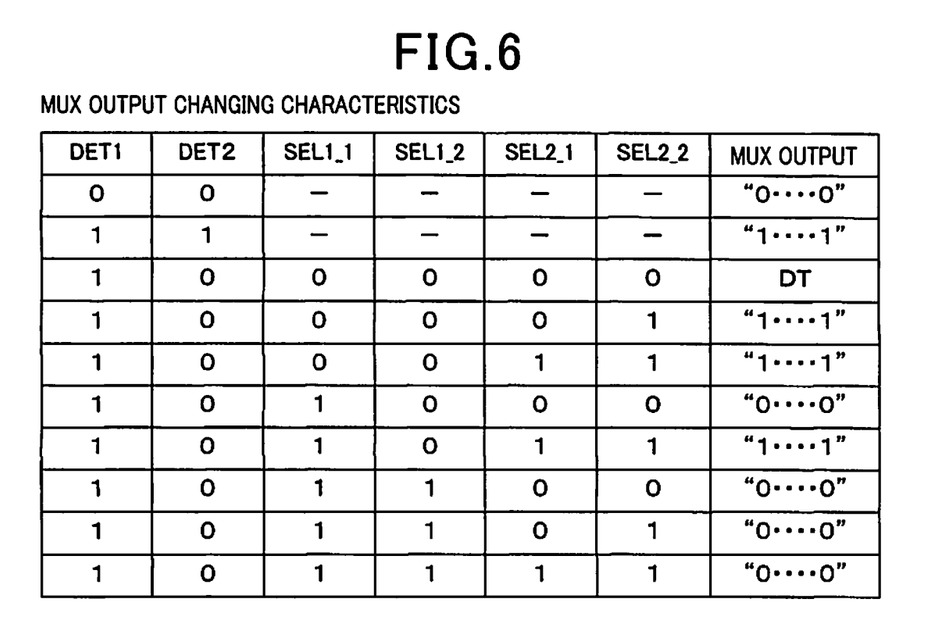
FIG. 6 is a diagram showing output changing characteristics of a multiplexer (MUX) shown in FIG. 4.

The MUX 42 changes numeric data to be outputted from the latch circuit 44 according to the output changing characteristics shown in FIG. 6.

Specifically, when both the changing signals DET1, DET2 outputted from the changing signal generator 50 are low levels (0, 0), that is, when Vin<Vd/2 as shown in FIG. 3A, the MUX 42 selects the fixed value "00 . . . 00".

In addition, when both the changing signals DET1, DET2 outputted from the changing signal generator 50 are high levels (1, 1), that is, when Vd≤Vin as shown in FIG. 3C, the MUX 42 selects the fixed value "11 . . . 11".

When the changing signal DET1 outputted from the changing signal generator 50 is at a high level (1), and the changing signal DET2 is at a low level (0), and when all the other changing signals SEL1_1, SEL1_2, SEL2_1, SEL2_2 are at a low level (0), the MUX 42 determines that the analog input signal Vin is within the allowable voltage range which is equal to or more than Vd/2 and less than Vd (Vd/2 ≤Vin<Vd) to select the numeric data DT received from the signal processing circuit 20.

Figure 7:
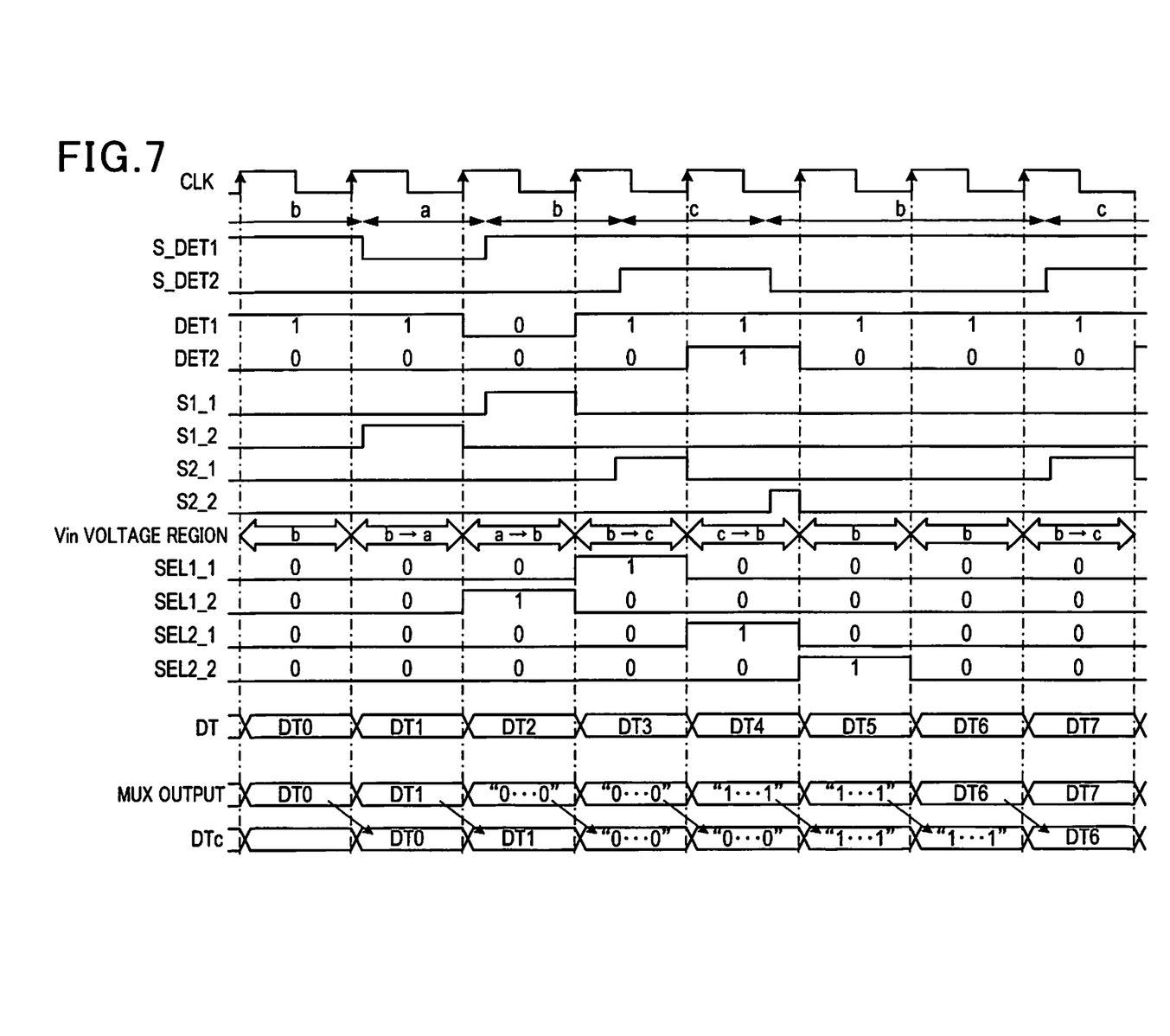
FIG. 7 is a time chart for explaining operation of the output changing circuit.

That is, as shown in FIG. 7, when the analog input signal Vin is changed from one of the three voltage regions a, b, c shown in FIGS. 3A, 3B, 3C to another of the three voltage regions a, b, c within one period of the operation clock CLK for A/D conversion, any of the changing signals SEL1_1, SEL1_2, SEL2_1, SEL2_2 becomes a high level (1). If the voltage region of the analog input signal Vin is not changed, the changing signals SEL1_1, SEL1_2, SEL2_1, SEL2_2 are kept at a low level (0).

Hence, when the changing signals DET1, DET2 are "1, 0" at rising timing of the operation clock CLK, and if at least one of the changing signals SEL1_1, SEL1_2, SEL2_1, SEL2_2 is at a high level (1), the MUX 42 is prohibited from selecting the numeric data DT received from the signal processing circuit 20.

When selecting the numeric data DT is prohibited, the MUX 42 selects the fixed value "00 . . . 00" representing the minimum value or the fixed value "11 . . . 11" representing the maximum value depending on a combination of values of the changing signals SEL1_1, SEL1_2, SEL2_1, SEL2_2.

Figure 8:
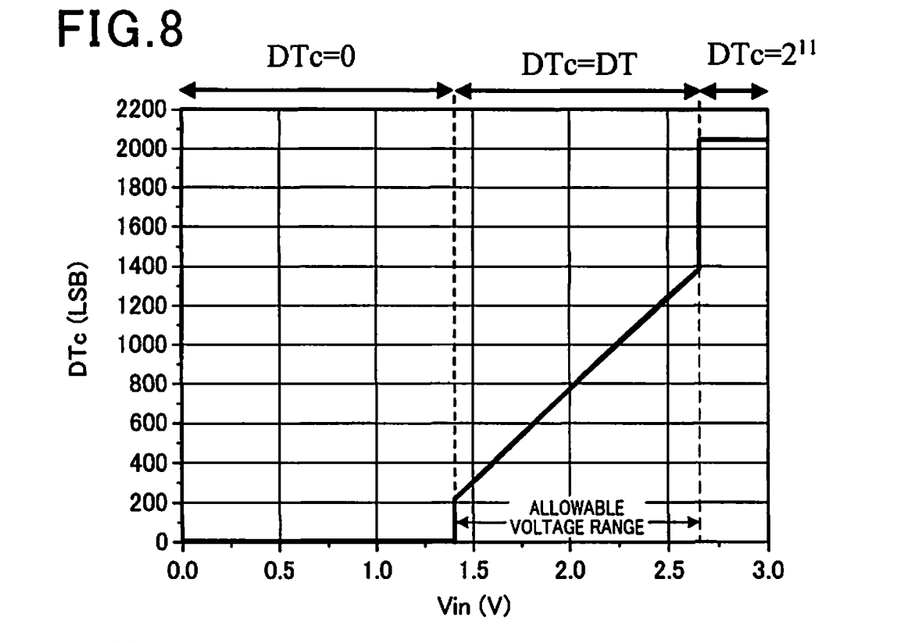
FIG. 8 is a diagram showing input-output characteristics of the A/D conversion apparatus according the embodiment.

Hence, according to the A/D conversion apparatus of the present embodiment, as illustrated in FIG. 8, only when the analog input signal Vin is within the allowable voltage range in which the A/D conversion can be normally operated, the numeric data DT received from the signal processing circuit 20 can be outputted as an A/D converted value of the analog input signal Vin.

In addition, when the analog input signal Vin is not within the allowable voltage range or is temporarily not within the allowable voltage range during A/D conversion, the fixed value "00 . . . 00" or the fixed value "11 . . . 11" is outputted as an A/D converted value. Hence, an apparatus utilizing the result of the A/D conversion of the analog input signal Vin can recognize abnormalities of the A/D conversion value.

Hence, according to the present embodiment, the reliability of the A/D conversion apparatus can be improved.

In addition, the A/D conversion apparatus of the present embodiment can be configured by only digital circuits, which include the level determination circuit 30 and the output changing circuit 40 realizing the output changing method of the present invention. Since the A/D conversion apparatus is not required to use analog circuits, the A/D conversion apparatus is easy to design and can be realized at small manufacturing cost.

It will be appreciated that the present invention is not limited to the configurations described above, but any and all modifications, variations or equivalents, which may occur to those who are skilled in the art, should be considered to fall within the scope of the present invention.

In the above embodiment, the level determination circuit 30, the output changing circuit 40 and the like are configured only by digital circuits including a latch circuit. However, they are not necessarily required to be configured only by digital circuits to realize the output changing method of the present invention. For example, whether the analog input signal Vin is within a predetermined allowable voltage range may be determined by using, for example, analog circuits including a comparator.

In addition, in the above embodiment, the buffer circuit 22 is operated by the power supply voltage Vd, which is the operating voltage of the A/D conversion apparatus. The buffer circuit 24 is operated by the voltage 2Vd, which is twice the power supply voltage Vd.

This aims to make outputs of the buffer circuits 22, 24 "0, 0" or "1, 1", which differs from those in normal time, when the pulse signal outputted from the RDL 10 is not within the allowable voltage range. However, operating voltage of the buffer circuits 22, 24 is not necessarily set as described above but may be appropriately changed.

In addition, although each of the buffer circuits 22, 24 is configured by connecting two stages of the inverting circuits (that is, NOT circuits), each of the buffer circuits 22, 24 may be configured by only one inverting circuit.

Hereinafter, aspects of the above-described embodiments will be summarized.

As an aspect of the embodiment, the A/D conversion apparatus receives an analog input signal subject to A/D conversion as power supply voltage of a pulse delay circuit as in the case of the conventional A/D conversion apparatus described above. Hence, delay units configuring the pulse delay circuit sequentially output pulse signals with a delay time depending on the analog input signal. An encoding circuit detects the number of stages of the delay units through which the pulse signal passes in the pulse delay circuit during a predetermined measurement time, and outputs numeric data corresponding to the number of stages.

In addition, according to the output changing method of the embodiment, a level determination circuit determines whether or not the analog input signal is within an allowable voltage range in which the A/D conversion apparatus can operate normally. An output changing circuit changes an A/D converted value to be outputted as a result of A/D conversion depending on the result of the determination by the level determination circuit.

That is, the output changing circuit outputs the numeric data generated by the encoding circuit as an A/D conversion value of the analog input signal if the analog input signal is within the allowable voltage range, and outputs numeric data formed of a predetermined specified value as the A/D conversion value if the analog input signal is not within the allowable voltage range.

According to the output changing method for an A/D conversion apparatus and the A/D conversion apparatus, when the analog input signal is not within the allowable voltage range shown in FIG. 9, the numeric data generated by the encoding circuit can be prevented from being outputted as an A/D conversion value of the analog input signal.

In addition, in an apparatus utilizing the result of the A/D conversion obtained by the A/D conversion apparatus, when an A/D conversion value outputted from the A/D conversion apparatus is not a specified value, the A/D conversion value can be recognized to be normal. Hence, according to the present embodiment, the reliability of the A/D conversion apparatus can be improved.

What is claimed is:

1. An A/D conversion apparatus, comprising:
 a pulse delay circuit in which a plurality of delay units, which delay a pulse signal by delay time depending on power supply voltage, are connected in series; and
 an encoding circuit which detects the number of stages of the delay units through which the pulse signal passes in the pulse delay circuit during predetermined measurement time, and outputs numeric data corresponding to the number of stages, wherein
 the A/D conversion apparatus receives an analog input signal as the power supply voltage of the pulse delay circuit to perform A/D conversion for the analog input signal, and further comprises;
 a level determination circuit which determines whether or not the analog input signal is within an allowable voltage range in which the A/D conversion apparatus operates normally;
 an output changing circuit which outputs the numeric data generated by the encoding circuit as an A/D conversion value if the analog input signal is within the allowable voltage range, and outputs numeric data formed of a predetermined specified value as the A/D conversion value if the analog input signal is not within the allowable voltage range;
 the level determination circuit performs level determination at intervals shorter than the measurement time of the encoding circuit,
 the output changing circuit outputs the numeric data generated by the encoding circuit as the A/D conversion value if the determination by the level determination circuit that the analog input signal is within the allowable voltage range is continued within the measurement time of the encoding circuit, and outputs the numeric data formed of the specified value as the A/D conversion value if it is determined by the level determination circuit that the analog input signal is not within the allowable voltage range within the measurement time of the encoding circuit;
 the level determination circuit comprises two latch circuits which input the pulse signal outputted from the pulse delay circuit to two buffer circuits whose threshold voltages are different from each other, and latch two signals passed through the buffer circuits by the pulse signal outputted from the pulse delay circuit, and
 the level determination circuit outputs the two signals latched by the latch circuits as determination signals indicating whether or not the analog input signal is within the allowable voltage range.

2. The A/D conversion apparatus according to claim 1, wherein operating voltage of one of the two buffer circuits, which has operating voltage higher than operating voltage of the other of the two buffer circuits, is higher than operating voltage of other circuits in the A/D conversion apparatus.

3. The A/D conversion apparatus according to claim 1, wherein operating voltage of one of the two buffer circuits, which has operating voltage lower than operating voltage of the other of the two buffer circuits, is higher than a threshold voltage of an input buffer which receives a signal from the pulse delay circuit in the encoding circuit.

4. The A/D conversion apparatus according to claim 1, wherein
 the output changing circuit comprises:
 determination signal latch circuits which latch two determination signals outputted from the level determination circuit at timing when the measurement time of the encoding circuit has passed;
 fixed value latch circuits which latch predetermined fixed values at an inversion timing of two determination signals outputted from the level determination circuit; and
 a selection circuit which selects numeric data formed of the specified value as the A/D conversion value, the selection circuit determining that a condition for outputting numeric data formed of the specified value is established when the two determination signals latched by the determination signal latch circuits are the same level or when the fixed values are latched by the fixed value latch circuits, and which selects the numeric data generated by the encoding circuit as the A/D conversion value if it is not determined that the condition for outputting numeric data is established.

5. The A/D conversion apparatus according to claim 4, wherein
 the encoding circuit periodically detects the number of stages of the delay unit through which the pulse signal is passed in the pulse delay circuit based on an operation clock whose one period is the measurement time, and
 the determination signal latch circuits latch the two determination signals outputted from the level determination circuit in synchronization with the operation clock of the encoding circuit.

6. The A/D conversion apparatus according to claim 4, wherein
 the selection circuit selects numeric data to be outputted as the A/D conversion value among numeric data formed of a plurality of predetermined specified values based on outputs of the determination signal latch circuits and the fixed value latch circuits, when outputting the numeric data formed of the specified value as the A/D conversion value.

* * * * *